(12) United States Patent
Solo De Zaldivar et al.

(10) Patent No.: US 6,617,697 B2
(45) Date of Patent: Sep. 9, 2003

(54) ASSEMBLY WITH CONNECTING STRUCTURE

(75) Inventors: Jose Solo De Zaldivar, Waedenswil (CH); Peter Baumgartner, Rueschlikon (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/015,720

(22) Filed: Nov. 30, 2001

(65) Prior Publication Data

US 2002/0084517 A1 Jul. 4, 2002

(30) Foreign Application Priority Data

Nov. 30, 2000 (DE) .......................... 100 59 765

(51) Int. Cl.⁷ .................. H01L 23/48; H01L 23/52; H01L 29/40
(52) U.S. Cl. .................. 257/781; 257/765; 257/758
(58) Field of Search ................ 257/782, 783, 257/778, 780, 781, 784, 777, 686, 758, 765, 750

(56) References Cited

U.S. PATENT DOCUMENTS

| | | | |
|---|---|---|---|
| 5,323,292 A | * | 6/1994 | Brzezinski |
| 5,600,180 A | * | 2/1997 | Kusaka et al. |
| 5,804,882 A | * | 9/1998 | Tsukagoshi et al. |
| 5,949,142 A | * | 9/1999 | Otsuka |
| 6,002,180 A | * | 12/1999 | Akram et al. |
| 6,016,013 A | * | 1/2000 | Baba |
| 6,335,568 B1 | * | 1/2002 | Yuzawa et al. |
| 6,465,879 B1 | * | 10/2002 | Taguchi |

\* cited by examiner

*Primary Examiner*—Sheila V. Clark
(74) *Attorney, Agent, or Firm*—Aaron Waxler

(57) ABSTRACT

The invention describes an assembly provided with a component and a substrate (7). The component and the substrate (7) are electrically interconnected by means of connecting structures (6, 8). The first connecting structure (6) of the component comprises aluminum, which simplifies the manufacture of the assembly.

8 Claims, 2 Drawing Sheets

ASSEMBLY WITH CONNECTING STRUCTURE

Figure 1:
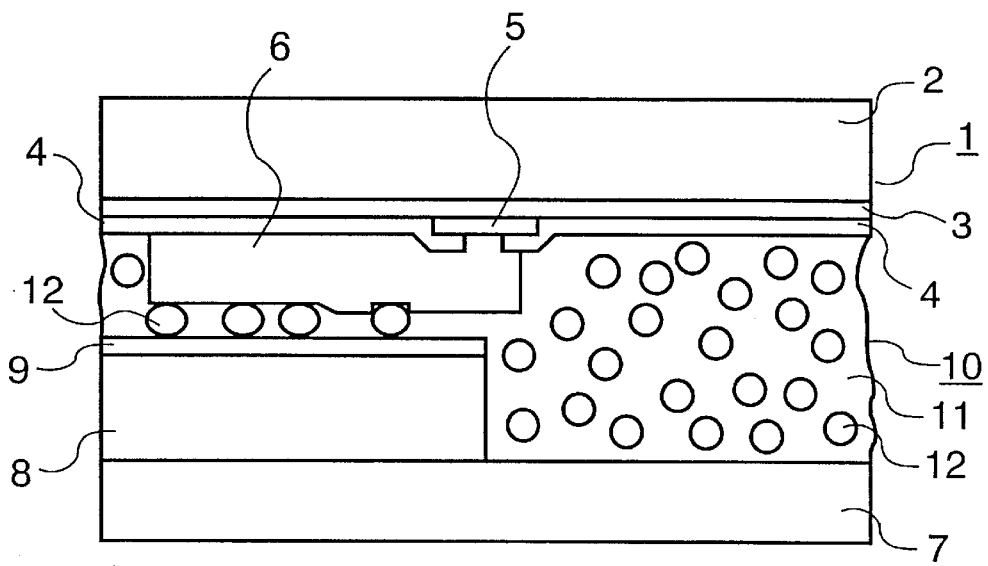

The invention relates to an assembly provided with a component and a substrate, said component comprising a first connecting structure and said substrate comprising a second connecting structure, and with an intermediate layer arranged between the component and the substrate.

Gold bumps in combination with a so-called ACF (Anisotropic Conductive Film) material may be used for fastening and electrical contacting of a chip with an integrated circuit on a substrate. For this purpose, the gold bumps on the chip are aligned with contact regions on the substrate and electrically connected thereto by means of ACF materials.

In the present state of the art of semiconductor manufacturing technology, the manufacture of the chip or the wafer and the manufacture of the gold bumps are spatially separated from one another. The reason for this is the incompatibility of the two processes. The gold bumps are created by gold-plating of the chip surface and subsequent lithographic structuring. As a noble metal, however, gold may readily contaminate portions of the equipment used for manufacturing the wafer, which would have dramatic consequences for the manufacturing output and performance of the wafer.

The spatial separation of the two manufacturing processes leads to a higher cost, for example because complicated logistics are necessary, several clean rooms are to be made available, and the lead times in the factories are longer.

Efforts to manufacture bumps from materials other than noble metals usually failed in that the bumps were not compatible with the Al pads on the chips which serve as supply contacts for the circuits on the chips. Thus, for example, neither Pt nor Pd can be contacted with the Al pads of a chip without brittle alloys of the two metals being formed. These brittle alloys degrade the electrical contact.

U.S. Pat. No. 5,563,449 describes a bump of Pd, Pt, or Ni. Two intermediate layers are provided between the bump and the Al pad. The first intermediate layer is an adhesion layer of tungsten or an alloy of tungsten, while the second intermediate layer comprises tungsten and a metal chosen from the group of Pd, Pt, Ni with a concentration gradient.

It is disadvantageous that two additional layers must be provided in this structure and that the second intermediate layer must have a concentration gradient, which clearly complicates the deposition and renders the manufacturing process more expensive.

It is an object of the present invention to counteract the disadvantages of the prior art and to provide an assembly with a component and a substrate which can be manufactured inexpensively.

This object is achieved by means of an assembly provided with a component and with a substrate, said component comprising a first connecting structure and said substrate comprising a second connecting structure, and with an intermediate layer arranged between the component and the substrate, wherein the first connecting structure of the component comprises aluminum.

The use of aluminum as a material for the first connecting structure renders the manufacture of the component simpler and less expensive, because only one layer is to be provided.

It is preferred that the component is a chip with an integrated circuit which comprises an upper metal layer.

The use of aluminum as the material for the first connecting structure (the so-called bumps) renders it possible for the latter to be manufactured in the same factory as the chip with the integrated circuit. This does away with the transport cost, and the logistics are simplified.

In addition, connecting structures comprising aluminum can be manufactured by means of sputtering and known photolithographic processes. These processes are less expensive and much less complicated than the process (electroplating) for manufacturing connecting structures comprising gold. Furthermore, the distances between the connecting structures may be made smaller by means of these processes. This is advantageous for the fastening of integrated circuits, which are becoming ever more complicated.

In addition, the sputtered connecting structures comprising aluminum have a uniform layer thickness, and fluctuations in the layer thickness of the first connecting structures merely lie in the nm range.

It is particularly strongly preferred that the first connecting structure of the component is directly connected to the upper metal layer of the integrated circuit.

No layers need be provided between the upper metal layer of the integrated circuit, the Al pads, and the first connecting structure of the component thanks to the use of aluminum in the connecting structure of the component. The contact may be achieved, for example, simply via a hole in the protective layer of the chip with the integrated circuit. The hole is filled with aluminum during the manufacture of the first connecting structure.

It is preferred that the intermediate layer comprises an ACF (Anisotropic Conductive Film) material.

A compact, coherent connection between the component and the substrate is obtained by means of an ACF material, which comprises a synthetic resin with conductive particles. The use of first connecting structures comprising aluminum on the component, which structures can be manufactured with a small fluctuation in the layer thickness, renders it possible for the conductive particles of the ACF material to have a small particle diameter. The density of conductive particles within the ACF material can be increased as a result of this. This leads to a low contact resistance between the component and the substrate.

It may be preferred that the intermediate layer comprises a polymeric material.

The intermediate layer may comprise a polymeric material for the purpose of manufacturing also a compact, coherent structure between the component and the substrate. In this embodiment, the electrical contacting between the first connecting structure and the second connecting structure takes place by means of thermocompression bonding. In this case, the first connecting structures comprising aluminum of the component are directly connected to a second connecting structure of the substrate, usually a supply line comprising copper with a gold coating. The resulting intermediate spaces are filled up with the polymeric material in this embodiment.

It is furthermore preferred that the substrate is chosen from the group of glass and foil.

After leaving the factory the finished chips with connecting structures comprising aluminum may be mounted immediately on glass (chip on glass, COG) or foil (chip on foil, COF).

Figure 2:
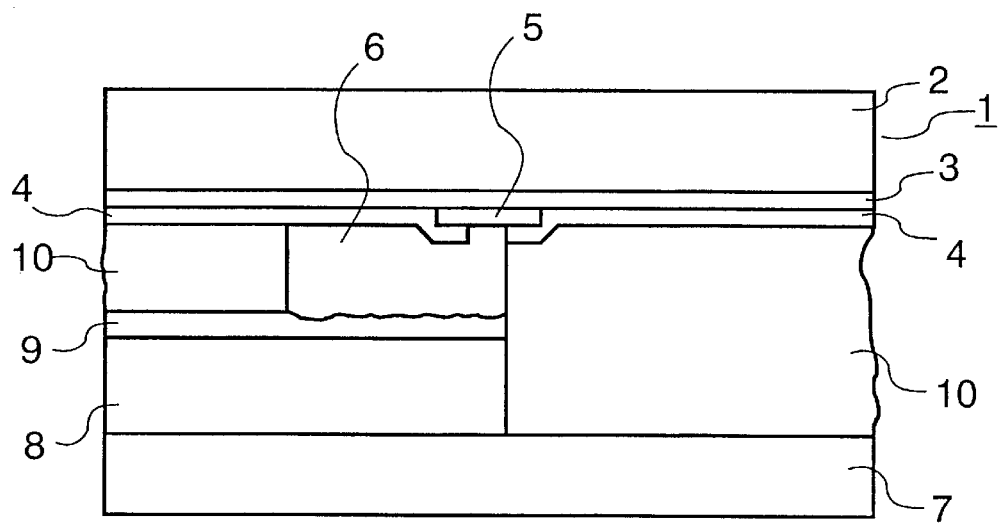
Figure 3:
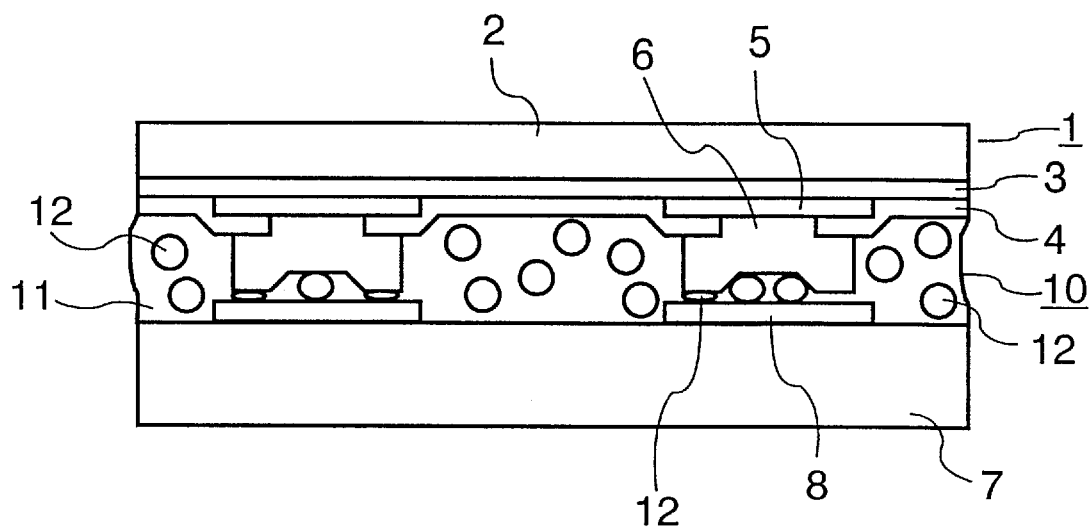

Embodiments of the invention will be explained in more detail below with reference to the drawings, in which FIG. 1 shows a chip mounted on foil in cross-section, FIG. 2 shows a chip mounted on foil by thermocompression bonding in cross-section, and FIG. 3 shows a chip mounted on glass in cross-section.

FIG. 1 shows a possible assembly of a component and a substrate 7. In this embodiment, the component is a chip 1 with an integrated circuit. The chip 1 comprises a semiconducting substrate 2 which was provided with active regions by means of various growing, implantation, and diffusion processes, i.e. an insulating layer 3, a protective layer 4, and a contact 5. The insulating layer 3, for example comprising $SiO_2$, serves for the electrical insulation of the chip 1 from the metal layers of the integrated circuit provided on the chip 1. The chip 1 with the integrated circuit has as its uppermost metal layer contacts 5 which are made of Al, AlSi, or AlCu. A protective layer 4, for example comprising $SiO_2$, is provided over the entire chip 1 with the integrated circuit. Each chip 1 with integrated circuit has at least one first connecting structure 6 whose layer thickness preferably lies between 2 and 6 $\mu$m. The first connecting structure 6 comprises Al, AlSi, or AlCu, and is directly connected to the integrated circuit of the chip 1 via a contact 5. The protective layer 4 has an opening in the region of a contact 5 for the electrical contacting of the first connecting structure 6 to the contact 5.

The chip 1 with the integrated circuit is connected to a foil serving as the substrate 7 in this embodiment. The foil may comprise, for example, polyimide. The substrate 7 comprises at least one second connecting structure 8 which preferably comprises Cu. The second connecting structure 8 has a coating 9, for example made of Ni/Au. This second connecting structure 8 with its coating 9 preferably has a height of between 10 and 15 $\mu$m. The layer thickness of the coating 9 is preferably between 200 and 500 nm. The contact between the first connecting structure 6 and the second connecting structure 8 of the substrate 7 is achieved by means of an ACF material which is arranged as an intermediate layer 10 between the chip 1 with the integrated circuit and the substrate 7. The intermediate layer 10 preferably has a layer thickness of between 10 and 25 $\mu$m, preferably between 10 and 20 $\mu$m. The ACF material comprises a synthetic resin 11 with conductive particles 12. The conductive particles 12 are, for example, synthetic resin globules which are coated with Au. The diameter of the conductive particles 12 preferably lies between 3 and 5 $\mu$m. The first connecting structure 6 of the chip 1 with the integrated circuit and the second connecting structure 8 of the substrate 7 are not directly interconnected in this embodiment, but the connecting structures 6, 8 are at a distance from one another which should be at most as great as the particle diameter of the conductive particles 12. The first connecting structure 6 of the chip with the integrated circuit and the second connecting structure 8 of the substrate 7 are contacted with one another by means of the conductive particles 12 which are present between the two connecting structures 6, 8.

FIG. 2 shows a further possible assembly with a component and a substrate 7. In this embodiment, again, a chip 1 with an integrated circuit is mounted on a substrate 7 in the form of a foil. In this embodiment, the first connecting structure 6 of the chip 1 with the integrated circuit and the second connecting structure 8 of the substrate 7 are directly connected to one another by means of thermocompression bonding. An interdiffusion layer with good electrical contact arises between the aluminum of the first connecting structure 6 and the gold layer of the coating 9 of Ni/Au of the second connecting structure 8. The intermediate layer 10 between the substrate 7 and the chip 1 with the circuit in this embodiment is filled up with a polymeric material such as, for example, an epoxy resin.

FIG. 3 shows a further assembly according to the invention comprising a component and a substrate 7. In this embodiment, a chip 1 with an integrated circuit is mounted on glass as the substrate 7. The second connecting structure 8 of the substrate 7 in this embodiment comprises indium-doped tin oxide (ITO). The first connecting structure 6 and the second connecting structure 8 are electrically contacted with one another in this embodiment by means of the conductive particles 12 of the ACF material which is present in the intermediate layer 10 between the chip 1 with the integrated circuit and the substrate 7. The connecting structures 6, 8 are again at a distance from one another, which distance corresponds at most to the particle diameter of the conductive particles 12.

The first connecting structure 6 of the component 1 may have any shape and may be chosen so as to conform with the chosen connecting technology (thermocompression bonding or the use of an ACF material). Thus the conductive particles 12 of the ACF material tend to migrate away from the region between the connecting structures 6, 8. It may be advantageous in this connecting technology that the connecting structures 6 of the component 1 have surface depressions of 1 to 4 $\mu$m depth and a diameter of between 3 and 10 $\mu$m, subject to the particle diameter of the conductive particles used. Preferably, the connecting structures 6, 8 have a cuboid shape. The three edges of the cuboid will have dimensions in the $\mu$m range.

What is claimed is:

1. An assembly provided with a component and with a substrate, said component comprising a chip having a first electrical connecting structure and said substrate comprising a second electrical connecting structure having a surface coating between it and said first electrical connecting structure, and with a single intermediate layer arranged between the chip and the substrate, wherein the first electrical connecting structure of the component comprises aluminum and the first and second electrical connecting structures are connected to each other via at least said surface coating, and wherein the component further includes an upper metal layer comprising aluminum that is directly connected to an upper surface of the aluminum first electrical connecting structure.

2. An assembly as claimed in claim 1, wherein the chip includes an integrated circuit which comprises the upper metal layer.

3. An assembly as claimed in claim 1, characterized in that the intermediate layer (10) comprises an ACF (Anisotropic Conductive Film) material.

4. An assembly as claimed in claim 1, characterized in that the intermediate layer (10) comprises a polymeric material.

5. An assembly as claimed in claim 1, characterized in that the substrate (7) is chosen from the group of glass and foil.

6. The assembly according to claim 1, wherein the single intermediate layer is arranged between the chip and the substrate adjacent to the directly connected first electrical connecting structure and second electrical connecting structure.

7. An assembly provided with a component and with a substrate, said component comprising a chip having a first electrical connecting structure and said substrate comprising a second electrical connecting structure having a surface coating between it and said first electrical connecting structure, and consisting of a single intermediate layer arranged between the chip and the substrate, wherein the first electrical connecting structure of the component comprises aluminum and the first and second electrical connecting structures are connected to each other via the single intermediate layer, and wherein the component further includes an upper metal layer comprising aluminum that is directly connected to an upper surface of the aluminum first electrical connecting structure.

8. The assembly according to claim 7, wherein the single intermediate layer comprises conductive particles dispersed therein, and a distance between the first electrical connecting structure and the second electrical connecting structure is at most as great as a particle diameter of the conductive particles.

* * * * *